United States Patent [19]
Galloway et al.

[11] Patent Number: 5,340,964
[45] Date of Patent: Aug. 23, 1994

[54] METHOD AND APPARATUS FOR MONITORING ELECTRICAL LOADS

[75] Inventors: Keith R. Galloway, Westchester; Dennis G. O'Keefe, Cincinnati, both of Ohio

[73] Assignee: Cincinnati Milacron Inc., Cincinnati, Ohio

[21] Appl. No.: 954,196

[22] Filed: Sep. 29, 1992

[51] Int. Cl.$^5$ .............................................. H05B 1/02
[52] U.S. Cl. .................................. 219/486; 219/485; 219/483; 219/497; 307/41; 361/87
[58] Field of Search ................... 219/483–486, 219/501, 505, 506, 497, 499, 494; 307/38–41; 361/87, 57

[56] References Cited

U.S. PATENT DOCUMENTS

| | | | |
|---|---|---|---|
| 4,421,976 | 12/1983 | Jurek | 219/506 |
| 4,552,102 | 11/1985 | Egle | 123/179 BH |
| 4,692,591 | 9/1987 | Cooley et al. | 219/295 |
| 5,071,459 | 12/1991 | Kuhn | 65/2 |
| 5,105,067 | 4/1992 | Brekkestran | 219/497 |
| 5,260,548 | 11/1993 | Todd et al. | 219/483 |

Primary Examiner—Mark H. Paschall
Attorney, Agent, or Firm—John W. Gregg

[57] ABSTRACT

Plural electrical loads supplied with power from a single source are monitored to detect defective loads. Each load is periodically individually energized and current delivered by the source is measured. Measured current for each load is compared with limit values to detect abnormal values. To overcome consequences of supply voltage fluctuations, supply voltage is also measured and admittance of each load is determined from measured current and measured voltage. The admittance value thus determined for each load is compared with limit values to detect abnormal values. Load monitoring of loads energized according to a control algorithm proceeds by periodic momentary suspension of energization according to the control algorithm and energization of selected individual loads.

14 Claims, 3 Drawing Sheets

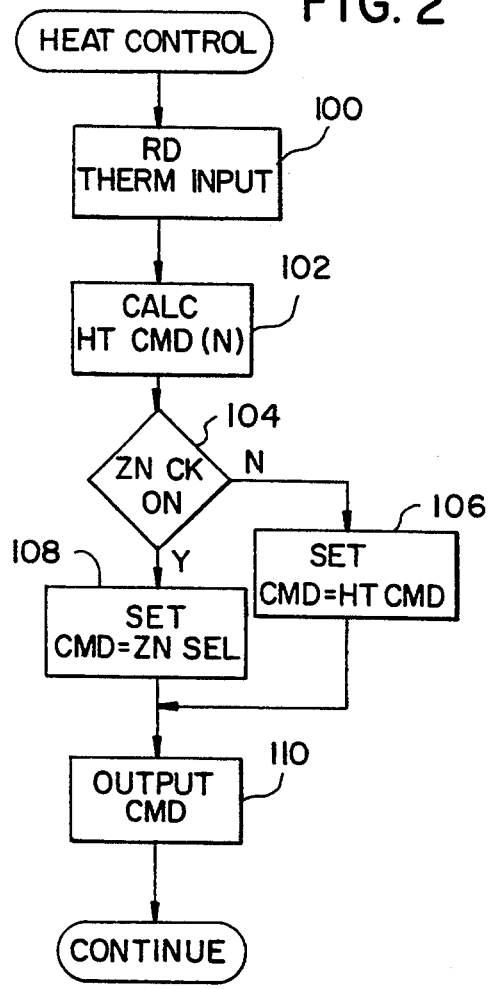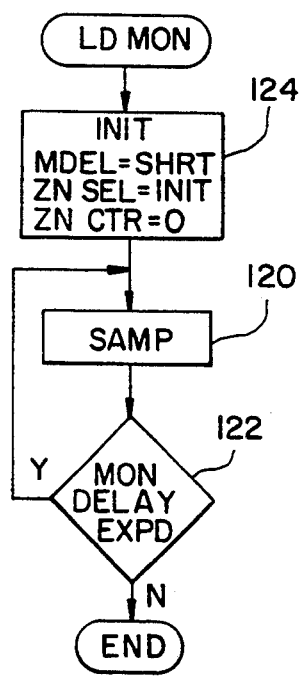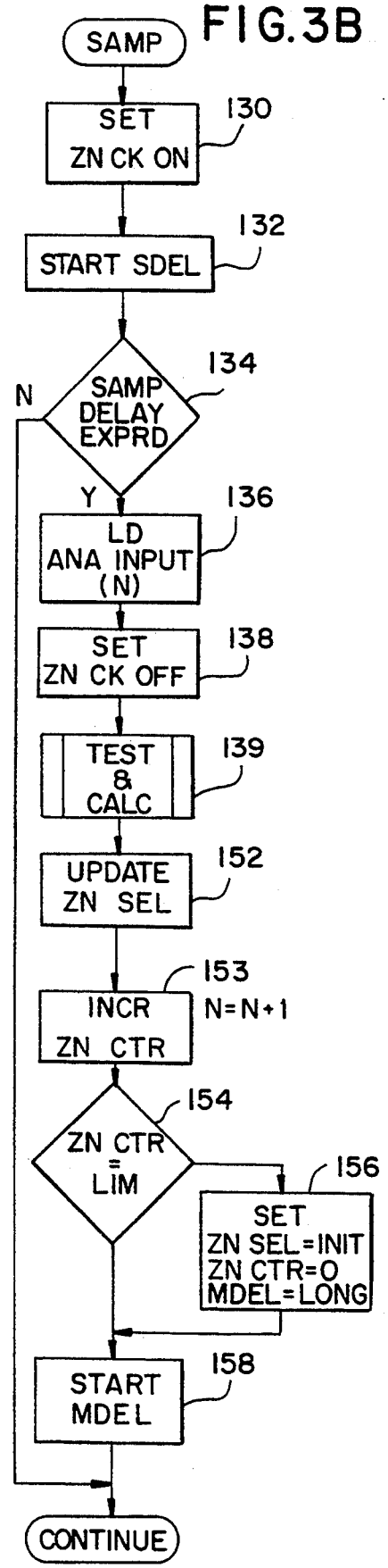

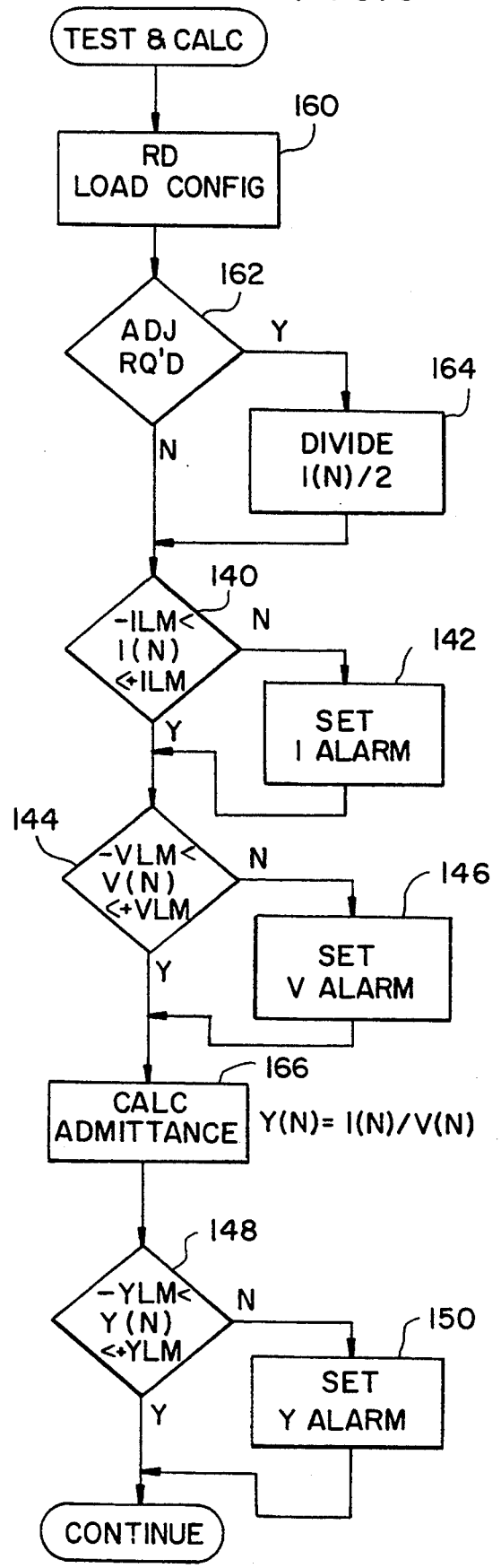

METHOD AND APPARATUS FOR MONITORING ELECTRICAL LOADS

BACKGROUND OF THE INVENTION

I. Field of the Invention

This invention relates generally to monitoring of electrical loads to detect an abnormal load magnitude. In particular this invention relates to monitoring of power delivered to plural electrical heating elements to detect an abnormal load magnitude of any one of the elements.

II. Description of the Prior Art

It is known to use individually controlled electrical heating bands to effect heating in apparatus for extrusion of plastic materials. Such heating bands may be used in conjunction with, for example, extruder barrel segments wherein material is plasticized and extruder outlet elements through which plasticized material is passed as it exits the extruder. It is known to monitor current delivered to the heating bands to detect abnormal operation thereof. In particular, it is known to use current transformers to monitor the current delivered to the electrical heaters. However, in instances involving relatively large total currents, it has been necessary to provide plural current transformers, each transformer being associated with a particular heating zone. Such known techniques do not provide monitoring of the applied voltage and are therefore susceptible of false determinations of abnormal heater operation in the event of applied voltage fluctuations.

SUMMARY OF THE INVENTION

It is one object of the present invention to monitor plural electrical loads supplied with power from a single source to detect defective loads as indicated abnormal values of current delivered to any of the loads, load current being determined by a single current sensor measuring current delivered by the power source.

It is a further object of the present invention to monitor plural electrical loads supplied with power from a single source to detect defective loads as indicated by abnormal values of load admittance of any of the loads.

It is a still further object of the present invention to control energization of a plurality of electrical loads to implement a control algorithm and to periodically determine admittance of each load to detect defective loads.

In accordance with the aforesaid objects a method and apparatus are provided for controlling energization of plural electrical loads to permit detection of abnormal values of admittance of any. A Hall effect sensor produces an actual current signal from a conductor selectably connectable to all of the loads. An actual voltage signal is produced representing the magnitude of supply voltage. Control signals effecting energization of the loads are produced in response to, alternatively, a control algorithm and a load monitoring routine. The load monitoring routine periodically effects deenergization of all but one load for a predetermined period. An admittance value is calculated in response to measured current and voltage signals sampled during this period. The value of admittance so determined is compared to a predetermined value and, if determined to be beyond an acceptable tolerance, an alarm signal is produced.

Further objects and advantages of the present invention shall become apparent from the accompanying drawings and the description thereof.

BRIEF DESCRIPTION OF THE DRAWINGS

FIG. 2 is a flow chart illustrating the overall cycle of operation of heating element control executed by the system of FIG. 1.

FIGS. 3a through 3c are flow charts illustrating load monitoring procedures in accordance with the invention.

DETAILED DESCRIPTION OF THE PREFERRED EMBODIMENT

Figure 1:
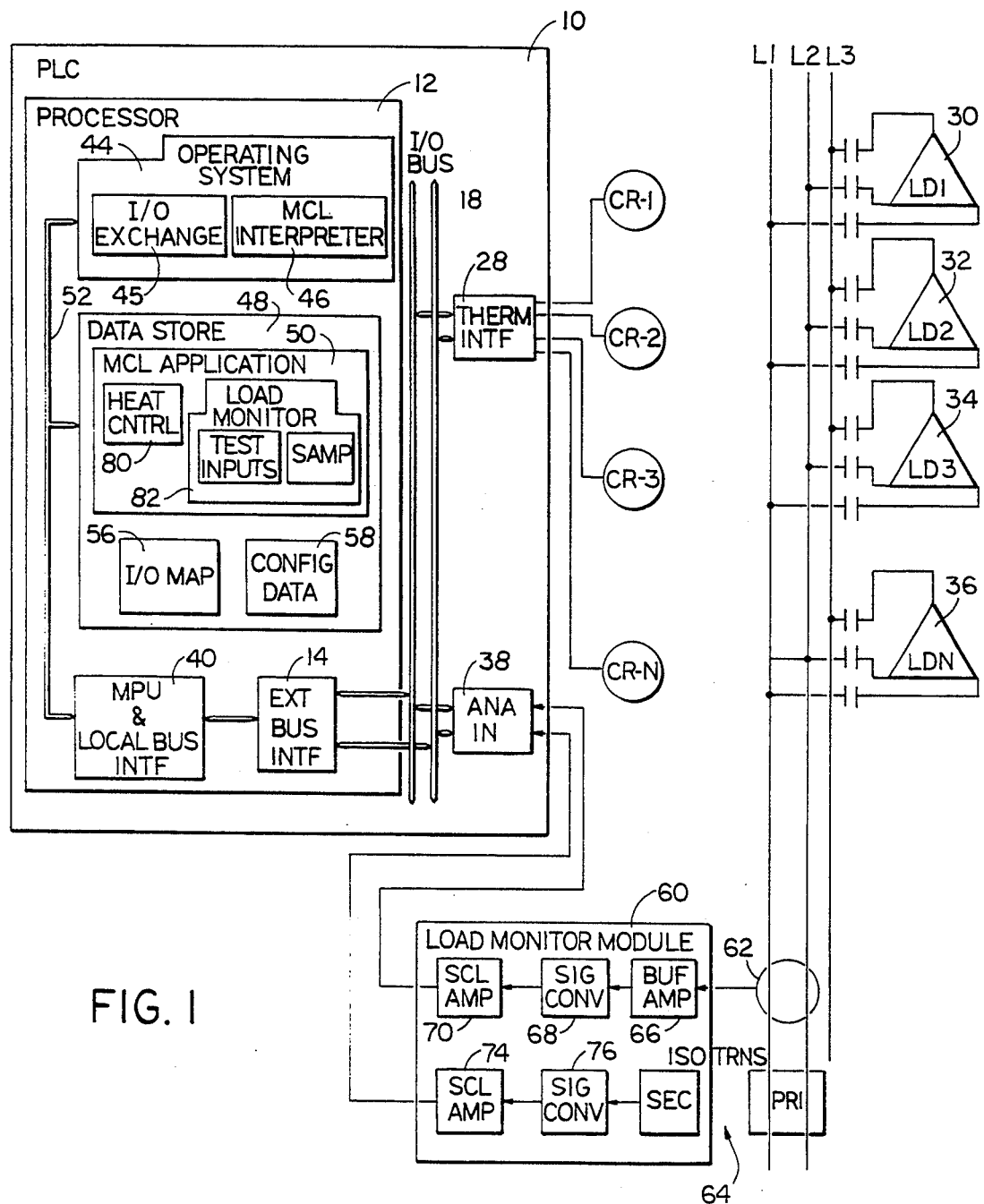
FIG. 1 is a block diagram illustrating a load monitoring system in accordance with the present invention.

To illustrate the present invention a heater control system developed for Cincinnati Milacron Inc., the assignee of the present invention shall be described in detail. While this system constitutes a preferred embodiment, it is not the intention of applicants that the scope of the present invention be limited to the details of the preferred embodiment. Rather, it is the intention of applicants that the scope of the invention be defined by the appended claims and all equivalents thereto.

CONTROL SYSTEM

Referring to FIG. 1 a block diagram of a control system implementing control in accordance with the present invention shall be described. Control system 10 includes a processor module 12, a bus adapter 14, and am input/output interface bus 18 for connection of a variety of signal interface modules. Data communication between processor 12 and input/output interface bus 18 is accomplished through bus adaptor 14, conforming, for example, to a standard bus definition for signal exchanges. Output signal interface modules are selected to produce, in response to digital command signals, analogue and binary control signals meeting the voltage and current requirements of the controlled devices. Input signal interface modules are selected to produce logic level digital representations of analogue and binary input signals representing conditions of machine devices.

Interface circuits for controlling heating elements 30 through 36 such as resistance heating bands applied to an extruder are provided at thermocouple interface module 28. This module provides amplifiers and bridge elements for use in conjunction with thermocouples mounted on the machine element for which temperature control is desired. Thermocouple interface module 28 produces digital representations of measured temperatures of machine components for access by processor 12. In addition, thermocouple interface module 28 provides switching devices to control energization of heating elements 30 through 36 in response to commands produced by processor 12. Preferably the switching devices are, for example, solid state current switching elements which may be controlled to conduct portions of an applied AC power source so as to interrupt current at or near the AC zero crossing points.

A load monitoring module 60 provides circuitry for measuring current and voltage applied to a selected heating element. While detection of a defect in a load may be effected by monitoring current alone in some instances, applicants have elected to determine admittance of a monitored load to detect a defect. Load admittance is calculated from measured current and voltage, so as to eliminate affects of line voltage fluctuations on the calculation of load admittance. A Hall Effect sensor interface 62 is used to produce AC analogue representations of the magnetic field produced by the current conducted through a selected heating element. Two lines of a three phase power source are monitored by Hall Effect sensors. In contrast to the use of current transformers, which, because of limits imposed on the current each may be used to conduct, require use of multiple transformers and permanent separation of loads, the Hall Effect sensor can be used irrespective of the magnitude of current to be measured without damage to the sensor. Therefore, in the three phase system, only a single pair of sensors is required to measure the total current supplied by the power source. Further, the Hall Effect sensors will not be damaged by current surges which would be harmful to current transformers or other in-line current sampling elements.

Continuing with reference to FIG. 1, the AC output signals of Hall Effect sensor interface 62 are buffered by buffer amplifier 66 and the buffered signals are summed. Summing accommodates an assumed delta configuration of load connection to the three phase source. However, the actual load configuration may not be a true delta and the sum may result in an apparent load current twice the actual. Correction, if required, is effected by the admittance calculation routines. The summed value is converted to a DC representation of current by signal converter 68. The DC current signal is scaled by scale amplifier 70 to produce an analogue representation of current having a predetermined voltage range for input to analogue input interface module 38. Isolation transformer 64 produces an analogue representation of the magnitude of voltage applied to a selected heating element. The source voltage signal is converted to DC by signal converter 76 and scaled by amplifier 74. Digital signals representing measured current and voltage are produced by analogue input interface 38 for use in calculation of admittance. While applicants have elected to effect calculation of admittance digitally, an admittance value may be produced by, for example, an analogue divider in response to the analogue representations of current and voltage to produce an analogue representation of admittance for input to analogue input module 38 after appropriate scaling.

To effect control in accordance with the present invention, the control system of FIG. 1 executes programs implementing heat control algorithms and load monitoring procedures. Programs are executed by processor module 12 which, in the preferred embodiment, conforms to the system architecture of a programmable logic controller such as is illustrated by U.S. Pat. No. 4,486,830. Other programmable logic controllers may be used, such as known controllers using relay ladder diagram programming, provided procedures implementing the functions described in detail hereinafter may be achieved. Programs defining operation of the controlled equipment are referred to as application programs 50 and are stored in a data store 48. Application programs 50 are executed by a microprocessor unit 40 under control of operating system programs stored in memory 44. Applicants have implemented microprocessor unit 40 using the 80386 microprocessor available from Intel Corporation. Data is exchanged between microprocessor 40, operating system store 44 and data store 48 via local bus 52.

Execution of application programs 50 effects control of heating elements 30 through 36 to control temperature, by, for example heat control routines 80, and to detect defective heating elements by, for example load monitoring routines 82. Application programs 50 define cycles of operation and are written using a machine control language (MCL). The MCL programs are executed by interpretive processing of program instructions by execution of MCL interpreter programs 46 stored in operating system memory 44. The cycles of operation relate values defined by or representing states of input and output devices. The devices are generally identified by variable names within application programs 50 and are associated with specific devices by means of input/output mapping data 56. Exchanges of input and output data values between input and output registers of processor 12 and input and output interface modules occurs periodically at a programmable cycle interval under control of I/O exchange control routines 45. Data store 48 includes configuration data store 58 wherein data associated with a particular controlled system is stored. Configuration data includes data to control correction of the apparent current magnitude produced by load monitor module 60 as required by the actual load connection configuration.

Temperature Control & Load Monitoring

Procedures for controlling the heating elements 30 through 36 to effect temperature control and detection of defective loads shall be described with reference to the flow charts of FIGS. 2 and 3a, 3b, and 3c. Temperature control is achieved by a closed loop algorithm relating measured temperature to set point values for commanding operation of the switching devices controlling energization of the heating elements. Detection of defective elements requires periodic suspension of temperature control and selection of each element to determine the power being supplied thereto for comparison with values expected during operation of a properly functioning element.

Temperature Control

A procedure for closed loop temperature control is illustrated by the flow chart of FIG. 2. At process step 100, signals representing measured temperature are read from, for example, thermocouple interface 28. At process step 102 heater command values are calculated in accordance with control algorithms relating the measured temperatures and parameters of the heating system employed. The heater command values define set point signals for controlling energization of heating elements 30 through 36 and may define, for example, a duty cycle of heating element energization required to achieve a desired temperature. The calculated heat commands are converted to patterns of energization of heating elements in accordance with the frequency of the power source and the commanded duty cycle. At decision step 104 a determination is made whether load monitoring is currently active by detecting the status of a flag controlled by the load monitoring procedures. If load monitoring is mot active, the heating element commands are set to values determined by the temperature control calculations at process step 106. If it is determined at decision step 104 that load monitoring is active, the heating element commands are set to values determined by the load monitoring procedure at process step 108. At process step 110 the heating element commands are output to thermocouple interface module 28 to produce the desired heating element control signals.

Load Monitoring

A procedure for load monitoring shall be described with reference to FIGS. 3a, 3b and 3c. The flow chart of FIG. 3a illustrates an overall procedure for load monitoring wherein sampling of inputs associated with a selected heating element is effected initially upon activation of the load monitoring subroutine and is thereafter repeated upon expiration of a programmable delay period. Applicants have provided for alternative values of the delay period to permit a shortened cycle for initial sampling of all inputs associated with all heating elements. In normal operation the delay interval is relatively long so as to permit domination of the temperature control algorithm in control of the energization of the heating elements. The alternative delay periods have the advantage of permitting early detection of a load fault upon activation of the heat control system while the machine element is warming up to operating temperature without unduly interfering with temperature control during normal operation. At process step 124 of the flow chart of FIG. 3a variables associated with load monitoring are initialized, including initialization of the monitor delay interval to the short period. Process step 120 denotes the procedure for sampling inputs. Upon completion of sampling of inputs associated with a selected heating element, the load monitor delay period is initiated. Once expired, as detected by decision step 122, the sampling procedure is reperformed. Until expiration of the load monitor delay period, execution of the heat control routines continues without interruption.

The flow chart of FIG. 3b illustrates the procedure used to effect sampling of inputs associated with selected heating elements. Execution of the sampling routine effects periodic isolation of each load and controls sampling of load current and applied voltage. At process step 130, a zone check flag is set indicating the load monitoring sampling routine is active. It will be recalled that the selection of commands used to control heating elements 30 through 36 is based on the state of this flag as indicated by decision step 104 of FIG. 2. During delay periods established by the load monitoring routines, the heating elements are controlled according to the heat control algorithms. During periods dedicated to load monitoring, the heating elements are controlled to effect isolation of a single load. At process step 132 a sample delay period is initiated to permit the settling of values available at the interface bus 18 from analogue input module 38. During the sampling delay interval, execution of the remainder of the sampling routine is skipped. Upon expiration of the sampling interval, as detected by decision step 134, the sampling of inputs associated with a selected heating element proceeds at process step 136 where the digital representations of measured current and voltage are read from analogue input interface 38. At process step 138 the zone check flag is reset to permit resumption of control of energization of heating elements 30 through 36 in accordance with the temperature control algorithm. At process step 139 a procedure to test the input samples and calculate admittance is executed. Details of the test and admittance determination procedure are illustrated by the flow chart of FIG. 3c and shall be described with reference thereto.

Continuing with reference to FIG. 3b, upon completion of sampling and testing of all inputs associated with a selected heating element, a selection control word ZN SEL is updated at process step 152 to enable selection of inputs associated with another heating element. The heat command value set at process step 108 of FIG. 2 which controls energization of the heating elements is the current value of the selection control word ZN SEL. Applicants have chosen to use a word of sufficient length to provide a single bit for each heating element, a control state value within the word being shifted one place with each update of the control word to effect selection of a single heating element for energization. To detect completion of sampling of all inputs, applicants have provided a counter incremented once at process step 153 such that the counter is incremented with each update of the selection control word. At decision step 154 the counter value is compared to a limit value and if equal to the limit, indicating that all of the inputs for all of the heating elements have been sampled, it is set to an initial value at process step 156. Once this counter has reached its limit value the short delay interval value loaded upon initialization at step 124 of FIG. 3a is replaced by the longer delay interval value and the selection control word is set to an initial condition. Thereafter execution of the load monitor procedure continues with initiation of the monitor delay interval at process step 158. With each execution of the input sampling procedure the selection control word is updated once and the counter is incremented once, effectively interleaving, at the delay interval, sampling of inputs associated with a selected heating element with temperature control of all heating elements.

The admittance determination procedure shall be described with reference to FIG. 3c. Before testing measured current or calculating admittance, it is necessary to adjust the value of measured current to correct for nonconformance of the actual load connection to a delta configuration. For loads not connected in a delta configuration and for which load current will be detected in both of the Hall sensors, it is necessary to divide the apparent current by two. For each load, load configuration data is stored indicating whether the division is required. At process step 160 the configuration data of a selected load is recalled from the configuration data store 58. At decision step 162 it is determined whether adjustment is required and, if required, the measured current value is divided by two at process step 164. At decision step 140 the sampled value of current, adjusted as needed for the actual load configuration, is compared to high (+ILM) and low (−ILM) limit values. In the event the sampled value exceeds a limit, an alarm is set at process step 142. At decision step 144 the sampled value of line voltage derived from isolation transformer 64 is compared to high (+VLM) and low (−VLM) limit values. If the sampled value of line voltage exceeds a limit value, an alarm is set at process step 146. At process step 166 a value for admittance is calculated by dividing the value of measured current by the value of measured voltage. At decision step 148 the calculated value of admittance is compared with high (+YLM) and low (−YLM) limit values. If the sampled value exceeds a limit value, an alarm is set at process step 150. While applicants contemplate sampling and testing of values of load current, line voltage, and admittance, it will be recognized that in the absence of line voltage fluctuations, load current alone will indicate a fault of a selected load. Consequently should the load current exceed a limit value the alarm set at process step 142 may indicate a load fault. Conversely, in the event line voltage fluctuations are to be expected a load fault may be indicated in the presence of an excess admittance alarm, set at process step 150, provided an excess voltage alarm has not also been set at process step 146.

We claim:

1. Apparatus for controlling plural electrical loads supplied with power from a single power source, the apparatus comprising:
   a. means for controlling energization of the loads to periodically isolate and energize singularly each of the loads;
   b. a single current sensing means for producing a current signal representing the current delivered by the power source; and
   c. means responsive to the current signal and the controlling means for detecting the value of the current signal during isolated energization of each load; and
   d. means responsive to the detecting means for determining whether the value of the current signal during isolated energization of each load is abnormal for the selected load.

2. The apparatus of claim 1 wherein the current sensing means further comprises:
   a. a Hall Effect sensor for producing an AC signal representing current delivered from the power source; and
   b. a single converter responsive to the AC signal for producing a DC current signal representing current delivered from the power source.

3. The apparatus of claim 2 wherein the Hall effect sensor includes sensing means for independently sensing current in two conductors of a three phase power source and the signal converter includes means for summing the values of current magnitudes sensed by the sensing means.

4. The apparatus of claim 3 wherein the means for detecting an abnormal value of the current signal further comprises means for adjusting the sensed value of current represented by the current signal in accordance with the connection configuration of the load.

5. Method to detect a fault in any of plural electrical loads supplied with power from a single source, the method comprising the steps of:
   a. controlling energization of the loads to periodically isolate and energize singularly each of the loads;
   b. producing a measured current signal representing actual current delivered from the power source;
   c. determining a value of admittance of each load as the ratio of the actual current delivered during isolated energization of each load to the voltage of the power source; and
   d. detecting an abnormal value of admittance, a load fault being indicated by an abnormal value of admittance.

6. The method of claim 5 wherein the step of determining the value of admittance further comprises the step of
   a. producing a measured voltage signal representing actual voltage of the power source.

7. The method of claim 5 wherein the step of detecting an abnormal admittance of a selected load further comprises the steps of:
   a. comparing the value of admittance determined for a load to limit values defining normal values of admittance of the load; and
   b. producing an alarm signal in response to detecting an abnormal value of admittance.

8. Method to detect abnormal admittance of any of plural electrical loads supplied with power form a single power source, the power being supplied to the loads in accordance with a control algorithm, the method comprising the steps of:
   a. periodically suspending energization of loads according to the control algorithm to isolate and energize singularly each of the loads;
   b. producing a measured current signal representing actual current delivered from the power source;
   c. determining a value of admittance of each load as the ratio of the actual current delivered during isolated energization of each load to the voltage of the power source; and
   d. detecting an abnormal value of admittance.

9. The method of claim 8 wherein the step of determining the value of admittance further comprises the step of
   a. producing a measured voltage signal representing actual voltage of the power source.

10. Apparatus to detect abnormal admittance of any of plural electrical loads supplied with power from a single power source, the apparatus comprising:
    a. means for producing a measured current signal representing actual current delivered from the power source;
    b. means for producing a measured voltage signal representing actual voltage of the power source;
    c. means for controlling energization of the loads to periodically isolate and energize singularly each of the loads;
    d. means responsive to the measured voltage signal and the measured current signal for producing in response to isolated energization of each load an admittance signal representing the admittance of each load; and
    e. means for detecting an abnormal value of admittance of the selected load.

11. The apparatus of claim 10 wherein the means for producing an admittance signal further comprises an analogue divider for determining the ratio of the value of two analogue signals.

12. The apparatus of claim 10 wherein the means for producing an admittance signal further comprises:
    a. means for producing digital representations of the actual voltage of the power source and actual current delivered from the power source; and
    b. means for dividing the value of the actual current by the value of the actual voltage.

13. Apparatus for controlling plural electrical heaters supplied with power from a single power source, the apparatus comprising:
    a. means for controlling energization of the heaters according to a temperature control algorithm for effecting temperature control;
    b. means for periodically suspending energization of the heaters according to the temperature control algorithm and for isolating and energizing singularly each of the heaters;
    c. single current sensing means for producing a current signal representing the current delivered form the power source; and
    d. means responsive to the current signal for producing a fault indicating signal in response to detection of an abnormal value of the current signal during isolated energization of a load.

14. The apparatus of claim 13 wherein the current sensing means further comprises:
    a. a Hall Effect sensor for producing an AC signal representing current delivered from the power source; and
    b. a signal converter responsive to the AC signal for producing a DC current signal representing current delivered from the power source.

* * * * *